United States Patent
Chooi et al.

(10) Patent No.: US 6,376,361 B1
(45) Date of Patent: Apr. 23, 2002

(54) METHOD TO REMOVE EXCESS METAL IN THE FORMATION OF DAMASCENE AND DUAL INTERCONNECTS

(75) Inventors: Simon Chooi; Mei Sheng Zhou; Tak Yan Tse, all of Singapore (SG)

(73) Assignee: Chartered Semiconductor Manufacturing Ltd., Singapore (SG)

( * ) Notice: Subject to any disclaimer, the term of this patent is extended or adjusted under 35 U.S.C. 154(b) by 0 days.

(21) Appl. No.: 09/419,510

(22) Filed: Oct. 18, 1999

(51) Int. Cl.$^7$ ......................................... H01L 21/4763
(52) U.S. Cl. ...................... 438/631; 438/626; 438/633; 438/636; 438/671
(58) Field of Search ................................ 438/618, 622, 438/625–627, 631, 633, 636–638, 645, 669, 671, 672, 691, 692

(56) References Cited

U.S. PATENT DOCUMENTS

| | | | |
|---|---|---|---|
| 4,954,459 A | | 9/1990 | Avanzino et al. ............ 437/228 |
| 5,151,168 A | | 9/1992 | Gilton et al. ................ 205/123 |
| 5,231,051 A | | 7/1993 | Baldi et al. .................. 437/187 |
| 5,578,523 A | | 11/1996 | Fiordalice et al. ........... 437/190 |
| 5,747,383 A | | 5/1998 | Chen et al. .................. 438/648 |
| 5,792,707 A | | 8/1998 | Chung ......................... 438/633 |
| 5,919,599 A | * | 7/1999 | Meador et al. ............ 430/271.1 |
| 5,981,385 A | * | 11/1999 | Huang ......................... 438/672 |
| 6,072,227 A | * | 6/2000 | Yau et al. .................... 257/642 |
| 6,093,656 A | * | 7/2000 | Lin ............................. 438/734 |
| 6,156,485 A | * | 12/2000 | Tang et al. ................. 430/313 |
| 6,184,138 B1 | * | 2/2001 | Ho et al. ..................... 438/687 |

* cited by examiner

Primary Examiner—Carl Whitehead, Jr.
Assistant Examiner—Jamie L. Brophy
(74) Attorney, Agent, or Firm—George O. Saile; Rosemary L. S. Pike

(57) ABSTRACT

A method of removing excess metal, particularly copper, in the fabrication of interconnects has been achieved. In accordance with the objects of this invention, a new method of removing excess metal in the formation of an interconnect has been achieved. A semiconductor substrate is provided. A dielectric layer is provided overlying the semiconductor substrate. Trenches are formed in this dielectric layer for planned damascene or dual damascene interconnects. A barrier layer is provided overlying the dielectric layer and lining the trenches. A metal layer is provided overlying the barrier layer and completely filling the trenches. A masking layer is deposited overlying the metal layer. The masking layer is patterned to form a mask that only overlies the trenches. The metal layer is etched down where not covered by the mask. This etching down is partial so that the barrier layer is not exposed. This etching down leaves the metal layer underlying the mask thicker than the metal layer not underlying the mask. The masking layer is etched away. The metal layer and the barrier layer are polished down to the top surface of the dielectric layer to form the planned interconnects, and the integrated circuit is completed.

21 Claims, 9 Drawing Sheets

METHOD TO REMOVE EXCESS METAL IN THE FORMATION OF DAMASCENE AND DUAL INTERCONNECTS

BACKGROUND OF THE INVENTION (1) Field of the Invention

The invention relates to a method of fabricating semiconductor structures, and more particularly, to a method of removing excess metal in the formation of damascene and dual damascene interconnects in the manufacture of integrated circuit devices.

(2) Description of the Prior Art

The use of copper for interconnects in integrated circuit technology is increasing. This is primarily due to the lower resistivity of copper when compared to the more traditional aluminum. The maturation of damascene technology has allowed copper to replace aluminum in many process schemes.

Damascene approaches allow copper interconnects to be formed without etching interconnect patterns directly into the copper. Rather, the interconnect pattern is etched into the dielectric material. The copper is then deposited overlying the dielectric material and filling the trenches etched into the dielectric. Finally, an etching or a polishing operation is used to remove the excess copper so that the metal only remains in the trenches.

The last step, where the excess copper is removed, is one that can cause problems in the art. To eliminate metal shorts, it is necessary to remove all of the copper above and outside the trench boundaries. However, if too much of the copper is removed, such that the trench is no longer completely filled, other reliability problems can occur.

Referring to FIG. 1, a cross-section of a partially completed prior art integrated circuit device is shown. A dual damascene process, one in which both the via plug and the metal trace is filled by the same metal deposition, is illustrated. A semiconductor substrate 10 is shown. The semiconductor substrate 10 could be composed of silicon or of several microelectronic layers that incorporate both insulating and conductive materials. Conductive traces 22 are formed overlying the semiconductor substrate 10. A dielectric layer 18 is deposited overlying the semiconductor substrate 10. The conductive traces 22 are formed through this dielectric layer 18 as shown.

Trenches have been etched into the dielectric layer 18. The trenches are formed to provide a connective via to the metal traces 22. The lower, narrower part of the trenches provides this connection. The trenches also will provide the next level of conductive traces. The upper, wider part of the trenches provides the pattern for the next level of conductive traces for the integrated circuit.

A barrier layer 26 has been deposited overlying the dielectric layer 18 and lining the trenches. The barrier layer is typically composed of a material that inhibits copper diffusion. This is important because copper ions can diffuse into the dielectric layer 18, which is typically silicon dioxide, under normal conditions and can cause reliability problems. This is a detrimental property of copper when compared to aluminum. In the prior art, the barrier layer 26 is typically composed of a combination of tantalum and tantalum nitride or a combination of titanium and titanium nitride or solely tantalum nitride.

A copper layer 30 is deposited overlying the barrier layer 26 and completely filling the trenches. A large amount of excess copper must be deposited to insure that the trenches are completely filled. This excess copper layer 30 must be removed to complete the definition of the interconnect traces. Note that, even with the large amount of excess copper, a significant valley 32 in the surface topology of the copper layer 30 occurs due to the large trenches that must be filled.

Referring now to FIG. 2, the excess copper layer 30 and barrier layer 26 are polished down. The typical process used is a chemical mechanical polish. Through chemical and mechanical action, this process removes the excess material from the top down. Ideally, the process is stopped by endpoint as soon as all of the excessive copper layer 30 and the barrier layer 26 are removed, that is, when the copper layer 30 and the barrier layer 26 that remain are confined to only the trenches. The resulting copper layer 30 thickness within the trenches should be the same as the thickness of the dielectric layer 18.

In reality, it is inevitable to have copper thickness loss within the trench. This is referred to as the dishing effect. This effect is not ideal, and it can cause significant reliability problems in the circuit.

The dishing effect has two main causes. First, the barrier layer 26 materials, such as tantalum and titanium, and the dielectric layer 18 have lower polishing rates than the copper layer 30. In addition, there is an inevitable non-uniformity of chemical mechanical polishing across the wafer. Therefore, an over-polish, beyond the detected endpoint, must be performed to ensure that the barrier layer 26 has been removed over the whole die and the whole wafer. These two factors relating to the lower polishing rate of the barrier layer 26 contribute to the significant copper thickness loss within the trenches.

Second, due the compressibility of the polishing pad used in the CMP, the valley topology 32 of the copper layer 30 top surfaces is polished away at the same time, though not necessarily the same rate, as the copper layer 30 overlying non-trench areas. Therefore, when the copper layer 30 and the barrier layer 26 in the non-trench areas are completely removed, the copper layer 30 in the trenches has been polished below the level defined by the dielectric layer 18 thickness.

Several prior art approaches disclose methods to fabricate interconnects and to planarize layers. Some of these methods use masking layers to enhance planarization. U.S. Pat. No. 4,954,459 to Avanzino et al discloses a method to planarize oxide for shallow trench isolation (STI) and inter-level dielectrics. A reverse mask of photoresist is used. The oxide is etched down where exposed by the photoresist mask. After the mask is removed, a chemical mechanical polish finishes the planarization. U.S. Pat. No. 5,792,707 to Chung teaches a process to planarize a dielectric layer where a reverse photoresist mask and a chemical mechanical polish step are used. U.S. Pat. No. 5,151,168 to Gilton et al discloses a process to create metalization patterns. A reverse image photoresist mask of the desired metal pattern is created over the wafer. The wafer is then plated to deposit the metal. U.S. Pat. No. 5,231,051 to Baldi et al teaches a process to fabricate metal contacts or vias. A metal layer is deposited overlying a dielectric layer and filling contact or via holes. The metal layer is etched down to the surface of the dielectric layer. A mask is formed overlying the via or contact plug area. A second etch is performed to remove any metal residue. The mask is then removed. U.S. Pat. No. 5,747,383 to Chen et al discloses a process to fabricate an interconnect layer where a conductive material is deposited overlying an insulating layer and filling the contact openings. The conductive material is etched down to the insulating material without over etching. A protective mask layer of magnesium oxide or silicon oxide is formed to protect the contact plugs. A second etching is performed to remove the remaining conductive material. The protective mask is removed. U.S. Pat. No. 5,578,523 to Fiordalice et al teaches a dual damascene process.

SUMMARY OF THE INVENTION

A principal object of the present invention is to provide an effective and very manufacturable method of removing excess metal in the formation of damascene and dual damascene interconnects in the manufacture of integrated circuits.

A further object of the present invention is to provide a method to remove excess metal in the formation of damascene and dual damascene interconnects where a mask and etch sequence is used to remove a part of the excess metal in non-trench areas prior to polishing down the remaining excess metal.

In accordance with the objects of this invention, a new method of removing excess metal in the formation of an interconnect has been achieved. A semiconductor substrate is provided. A dielectric layer is provided overlying the semiconductor substrate. Trenches are formed in this dielectric layer for planned damascene or dual damascene interconnects. A barrier layer is provided overlying the dielectric layer and lining the trenches. A metal layer is provided overlying the barrier layer and completely filling the trenches. A masking layer is deposited overlying the metal layer. The masking layer is patterned to form a mask that only overlies the trenches. The masking layer is patterned to be somewhat larger than the trenches. The metal layer is etched down where not covered by the mask. This etching down is partial so that the barrier layer is not exposed. This etching down leaves the metal layer underlying the mask thicker than the metal layer that is not underlying the mask. The masking layer is ashed or stripped away. The metal layer and the barrier layer are polished down to the top surface of the dielectric layer to form the planned interconnects, and the integrated circuit is completed.

Also in accordance with the objects of this invention, a new method of removing excess metal in the formation of an interconnect has been achieved. A semiconductor substrate is provided. A dielectric layer is provided overlying the semiconductor substrate. Trenches are formed in this dielectric layer for planned damascene or dual damascene interconnects. A barrier layer is provided overlying the dielectric layer and lining the trenches. A metal layer is provided overlying the barrier layer and completely filling the trenches. An organic bottom anti-reflective coating layer, called an organic BARC layer, is deposited overlying the metal layer. A masking layer is deposited overlying the organic BARC layer. The masking layer is patterned to form a mask that only overlies the trenches. The masking layer is patterned to be somewhat larger than the trenches. The organic BARC layer is etched down to the metal layer. The metal layer is etched down where not covered by the mask and the organic BARC layer. This etching down is partial so that the barrier layer is not exposed. This etching down leaves the metal layer underlying the mask thicker than the metal layer that is not underlying the mask. The masking layer is etched away. The organic BARC layer is ashed or stripped away. The metal layer and the barrier layer are polished down to the top surface of the dielectric layer to form the planned interconnects, and the integrated circuit is completed.

Also in accordance with the objects of this invention, a new method of removing excess metal in the formation of an interconnect has been achieved. A semiconductor substrate is provided. A dielectric layer is provided overlying the semiconductor substrate. Trenches are formed in this dielectric layer for planned damascene or dual damascene interconnects. A barrier layer is provided overlying the dielectric layer and lining the trenches. A metal layer is provided overlying the barrier layer and completely filling the trenches. An inorganic bottom anti-reflective coating layer, called an inorganic BARC layer, is deposited overlying the metal layer. A masking layer is deposited overlying the inorganic BARC layer. The masking layer is patterned to form a mask that only overlies the trenches. The masking layer is patterned to be somewhat larger than the trenches. The inorganic BARC layer is etched down to the metal layer. The masking layer is ashed or stripped away leaving the inorganic BARC layer as the hard mask. The metal layer is etched down where not covered by the inorganic BARC mask. This etching down is partial so that the barrier layer is not exposed. This etching down leaves the metal layer underlying the mask thicker than the metal layer not underlying the mask. The inorganic BARC layer, the metal layer and the barrier layer are polished down to the top surface of the dielectric layer to form the planned interconnects, and the integrated circuit is completed.

BRIEF DESCRIPTION OF THE DRAWINGS

In the accompanying drawings forming a material part of this description, there is shown:

FIG. 3 and FIGS. 9 through 13 schematically illustrate in cross-sectional representation a second preferred embodiment of the present invention.

FIG. 3, FIGS. 9 and 10, and FIGS. 14 through 17 schematically illustrate in cross-sectional representation a third preferred embodiment of the present invention.

DESCRIPTION OF THE PREFERRED EMBODIMENTS

These embodiments disclose the application of the present invention to the formation of dual damascene interconnects in the fabrication of an integrated circuit device. The present invention could also be easily applied to the formation of single damascene, or, simply, damascene interconnects with no modification. Further, it should be clear to those experienced in the art that the present invention can be applied and extended without deviating from the scope of the present invention.

Figure 1:
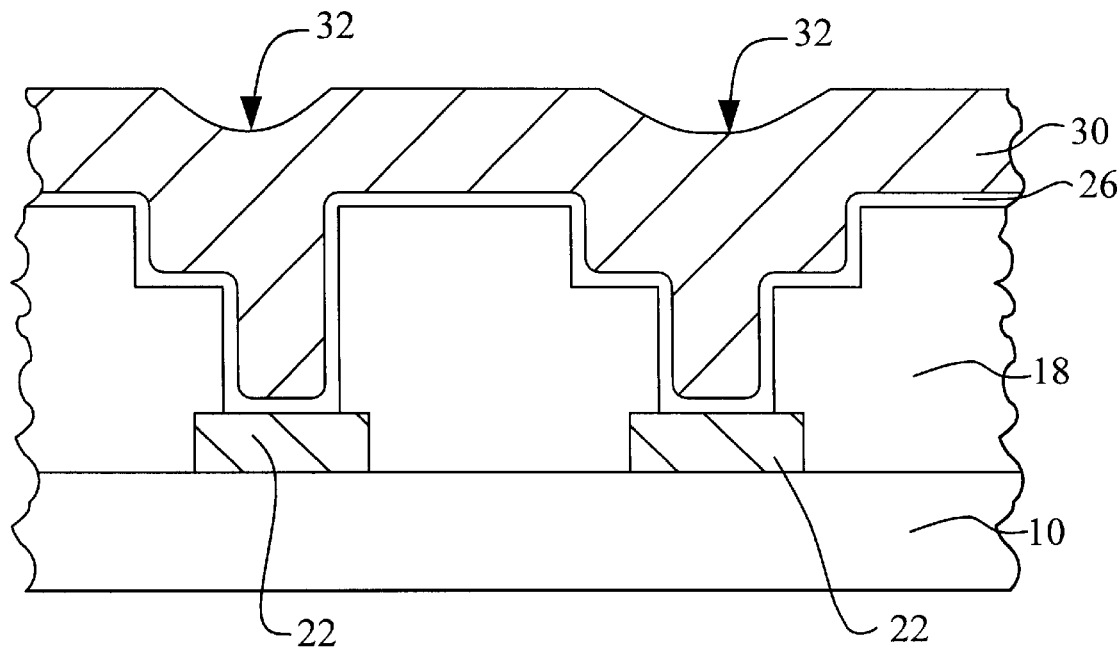
FIGS. 1 and 2 schematically illustrate in cross-section a partially completed prior art integrated circuit device. A process to remove excess metal in the fabrication of a dual damascene interconnect is depicted.
Figure 2:
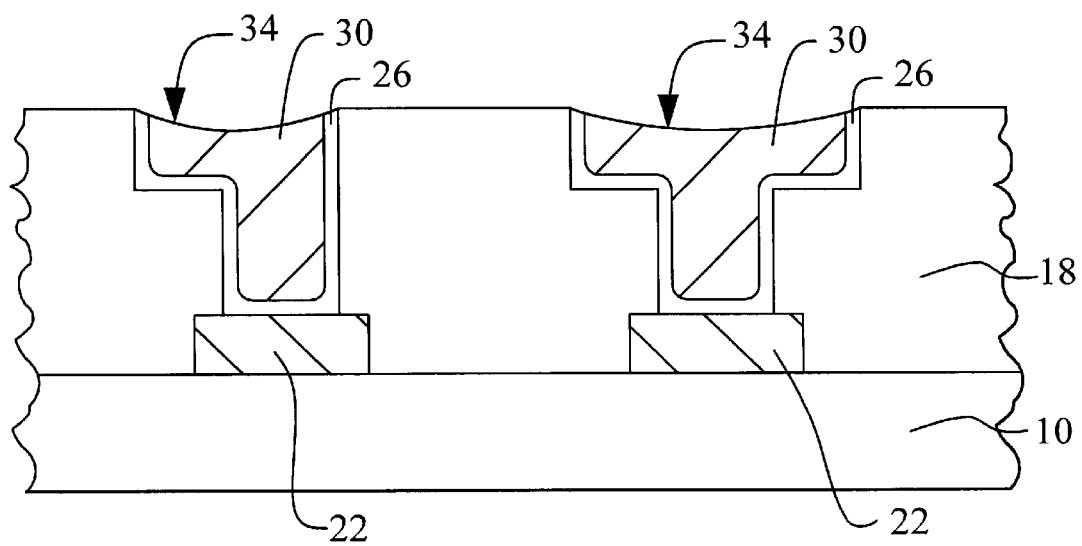
Figure 3:
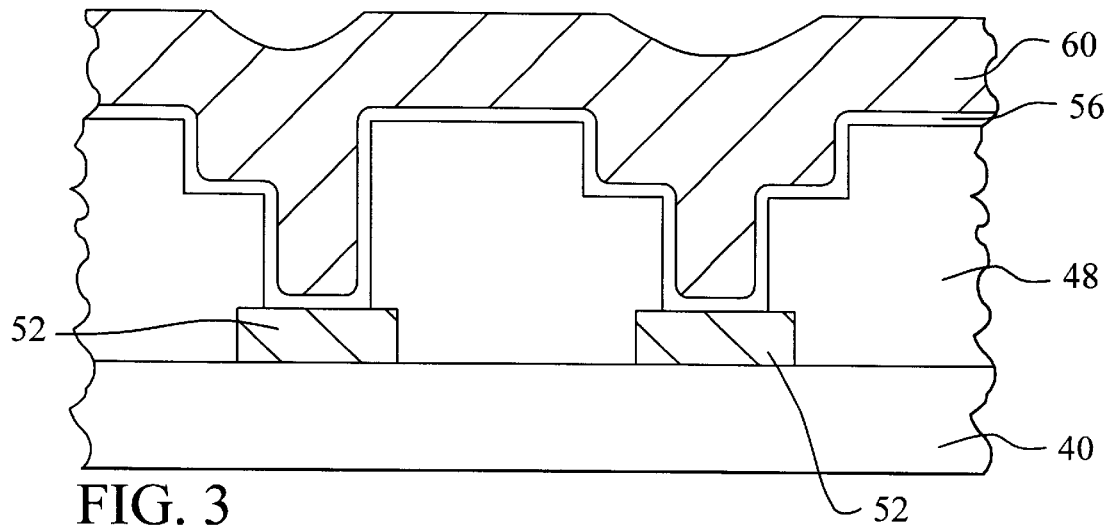
FIGS. 3 through 8 schematically illustrate in cross-sectional representation a first preferred embodiment of the present invention.

Referring now particularly to FIG. 3, there is shown a cross section of a partially completed integrated circuit device of the first preferred embodiment. A semiconductor substrate 40, typically consisting of monocrystalline silicon, is provided. Although not specifically illustrated in FIG. 3, layer 40 may also comprise one or several additional layers as are commonly employed within the art. Such additional layers may independently be formed of microelectronic materials including, but not limited to, conductor materials, semiconductor materials, and dielectric materials. The dielectric layer 48 is formed overlying the semiconductor substrate 40 and forms an interlevel isolation. The dielectric layer 48 in practice may actually be composed of multiple levels of dielectric materials. For example, an etching stop layer for the large upper trench and a passivation layer for the metal trace 52 may be included as part of the dielectric layer 48. In this case, both the etching stop layer and the passivation layer would typically comprise silicon nitride. This is not a critical feature of the present invention, therefore, for the sake of simplicity, the dielectric layer 48 is shown as a unit.

Trenches have been formed in the dielectric layer 48 to expose the top surfaces of the conductive traces 52. The trenches are of a type typical to dual damascene technology. The trenches may be formed by a single etch or may involve multiple etch steps. As is conventional in the art, the lower and narrower part of the trenches is the via that connects the lower conductive traces 52 with the subsequently formed upper traces. Conductive traces 52 may be composed of: copper, tungsten, a multiple stack comprising titanium nitride, titanium, and aluminum, or a multiple stack comprising a metal silicide and doped polysilicon. The upper and wider part of the trenches is where the upper traces will be formed. As with conventional dual damascene techniques, both the vias and the upper conductive traces are formed using a single deposition of metal.

A barrier layer 56 is deposited overlying the dielectric layer 48 and lining the trenches. The purpose of the barrier layer is to prevent the out diffusion of the metal layer 60 in the case where the metal layer 60 comprises all or nearly all copper. The barrier layer 56 preferably comprises one of the group of: tantalum nitride, tungsten nitride, tantalum silicon nitride (TaSiN), a composite layer of titanium nitride and titanium, and a composite layer of tantalum nitride and tantalum. The barrier layer 56 may be deposited by chemical vapor deposition (CVD) or a physical vapor deposition (PVD) and has a thickness of between about 50 Angstroms and 2,000 Angstroms.

The metal layer 60 is deposited overlying the barrier layer 56 and completely filling the trenches. The metal layer 60 is preferably composed of copper. The copper may be deposited by physical vapor deposition (PVD), chemical vapor deposition (CVD), electrochemical plating, or electroless plating. All of these methods are well known in the art. In the preferred embodiment, the copper is deposited by PVD and electrochemical plating to a thickness of between about 5,000 Angstroms and 50,000 Angstroms. Note how the metal layer 60 in the preferred embodiment exhibits the same valley topology overlying the trenches as in the prior art example.

Figure 4:
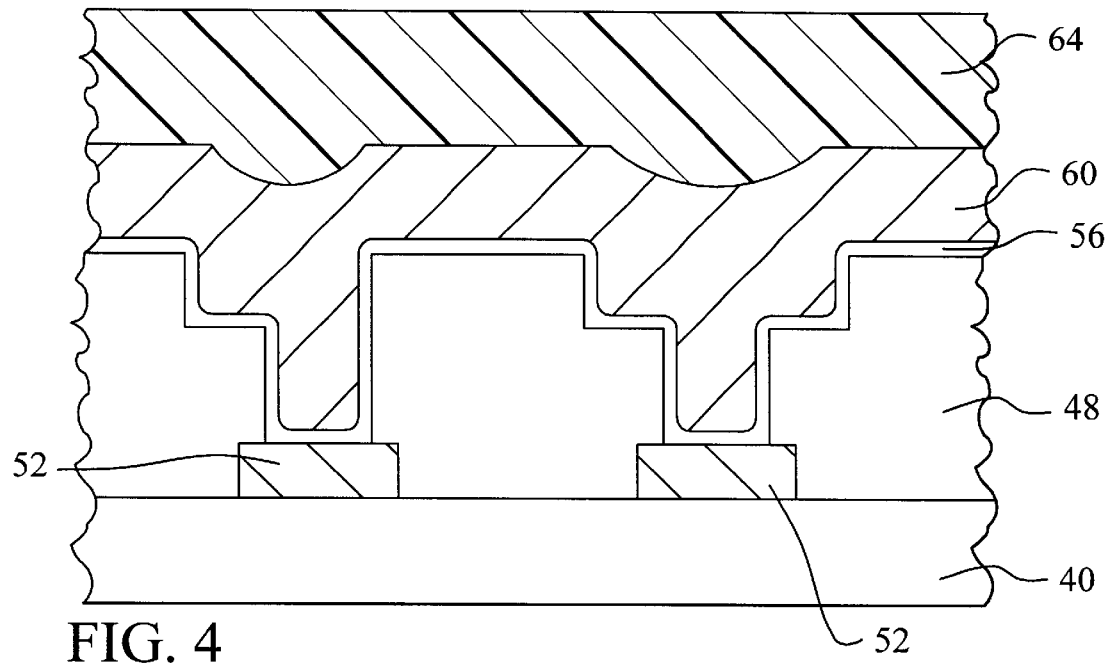

Referring now to FIG. 4, a masking layer 64 is deposited overlying the metal layer 60. The masking layer 64 is preferably photoresist. This photoresist may be of positive or negative type. The masking layer is deposited by spin coating to a thickness of between about 3,000 Angstroms and 15,000 Angstroms.

Figure 5:
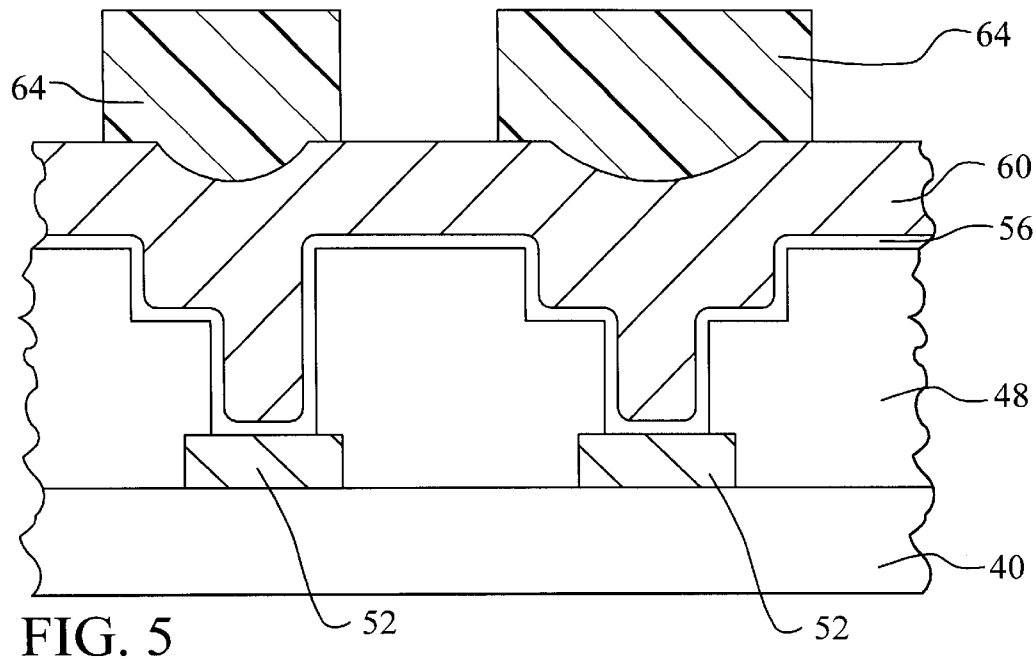

Referring now to FIG. 5, an important aspect of the present invention is disclosed. The masking layer 64 is patterned to form a mask that only overlies the trenches. The masking layer 64 is patterned to be somewhat larger than the trenches. The formation of this mask may be accomplished in one of two ways. First, the photolithographic mask used to create the upper trench pattern can be reversed so that a masking layer of positive photoresist will remain overlying the trenches following development. Second, negative photoresist can be used with the same photolithographic mask used for the upper trenches without reversing. In either case, the photolithographic mask will be sized-up so that the mask formed overlying the trenches will be larger than the trenches.

In the preferred embodiment, the mask is formed by using positive photoresist for the masking layer 64. The photolithographic mask is a reversed version of the upper trench mask sized-up between about 0.1 microns and 5.0 microns per side.

Figure 6:
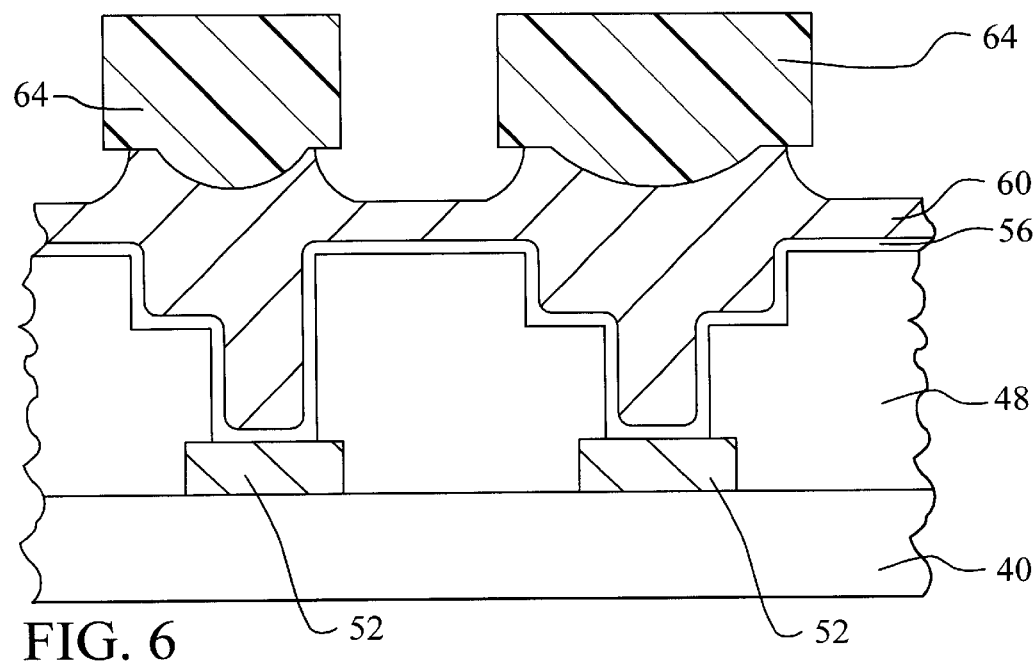

Referring now to FIG. 6, the metal layer 60 is etched down in areas not covered by the mask 64. The etching down is performed using a wet etching process. The wet etching process may comprise a buffered oxide etching (BOE) consisting of $NH_4F$, HF, and $H_2O$, with or without a surfactant. A second alternative is dilute HF with or without a surfactant. A third alternative is a developer, such as tetramethylammonium hydroxide (TMAH), tetraethylammonium hydroxide (TEAH), or tetrapropylammonium hydroxide (TPAH), with or without a surfactant. A fourth alternative is $NH_4F$, $CH_3COOH$, and $H_2O$, with or without a surfactant.

If an anisotropic wet etch is desired, benzotriazole (BTA) may be added to any of the above wet etch chemistries. Alternatively, a plasma dry etching using, for example, chlorine with or without $BCl_3$ may be used. In this preferred embodiment, a wet etch chemistry of BOE with surfactant is used.

The metal layer 60 is only partially etched down by the wet etch. The underlying barrier layer 56 is not exposed. The metal layer 60 is etched sufficiently that the metal underlying the mask is thicker than the metal not underlying the mask.

Figure 7:
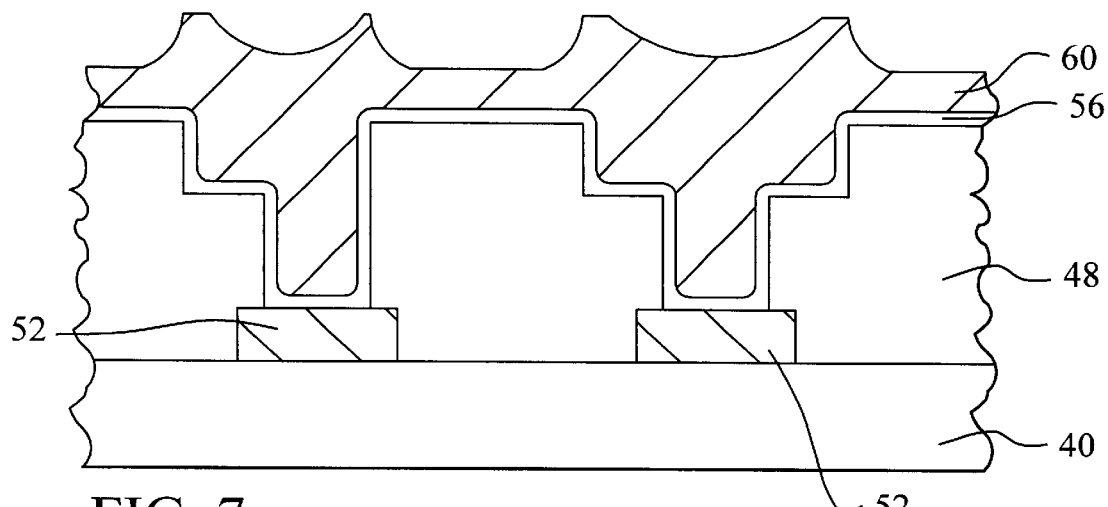

Referring now to FIG. 7, the remaining masking layer 64 is etched away. In the preferred embodiment, the masking layer 64 is photoresist that can be stripped away using a conventional stripping process such as oxygen plasma ashing or a wet chemical strip. Following the removal of the masking layer 64, the metal layer 60 clearly shows the greater thickness of metal that must be removed overlying the trench areas.

Figure 8:
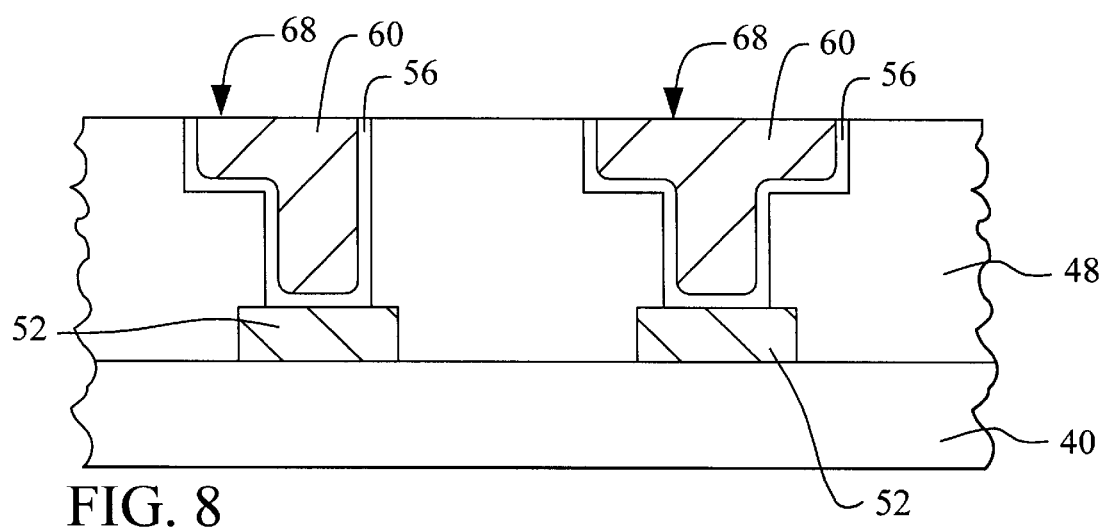

Referring now to FIG. 8, the metal layer 60 and the barrier layer 56 are polished down to the top surface of the dielectric layer 48. The polishing down is performed using a conventional chemical mechanical polish (CMP) operation selective to copper and the barrier material (tantalum nitride and tantalum, for example). The greater thickness of the metal layer 60 overlying the trenches provides additional polishing time for both the metal layer 60 and the barrier layer 56 to be completely removed from the non-trench areas. No dishing is seen over the trenches, rather, a flat surface topology 68 is achieved.

Referring back to FIG. 3, a second preferred embodiment is now disclosed. The second preferred embodiment begins with the integrated circuit device shown in FIG. 3.

Figure 9:
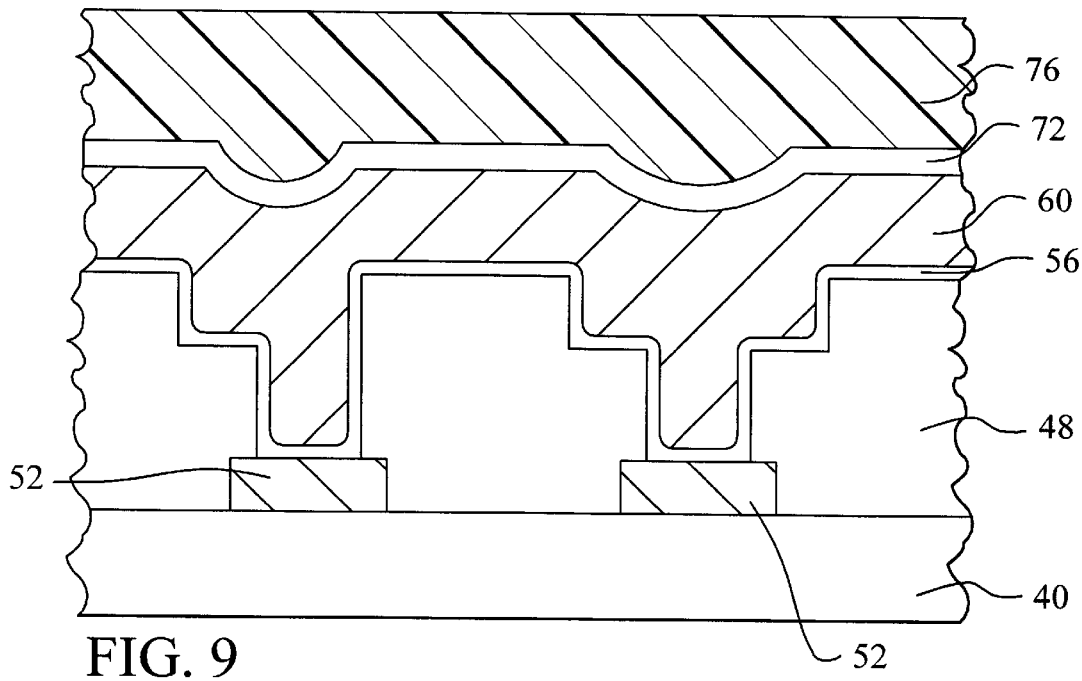

Referring now to FIG. 9, an important feature of the second embodiment of the present invention is disclosed. An organic bottom anti-reflective coating layer 72, called an organic BARC layer 72, is deposited overlying the metal layer 60. The purpose of the organic BARC layer 72 is to improve the photolithographic process used to define the etching mask by reducing the reflectivity of the metal layer 60. Without a BARC layer 72, reflections of incident light off the metal layer 60 during the photolithography process can cause distortion in the exposure of the photoresist. The organic BARC layer 72 also keeps the photoresist material out of contact with the metal layer 60 to prevent contamination. The organic BARC layer 72 can be any of the group comprising: polyacrylate-based material, poly (arylsulfonate)-based material (for example, AR-2 manufactured by Shipley). The organic BARC layer 72 is typically deposited by a spin-coating method to a thickness of between about 100 Angstroms and 2,000 Angstroms.

A masking layer 76 is deposited overlying the organic BARC layer 72. The masking layer 76 is preferably photoresist. This photoresist may be of positive or negative type. The masking layer 76 is deposited by spin coating to a thickness of between about 3,000 Angstroms and 15,000 Angstroms.

Figure 10:
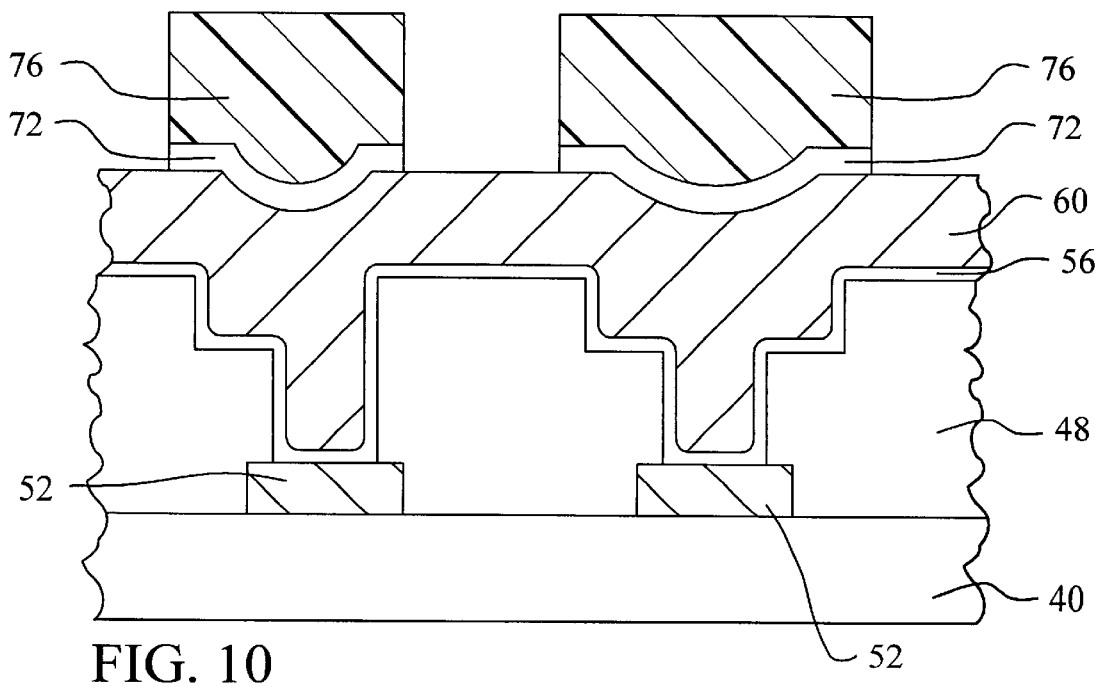

Referring now to FIG. 10, the masking layer 76 is patterned to form a mask that only overlies the trenches. The masking layer is patterned to be somewhat larger than the trenches. The BARC layer 72 is then etched down to the metal layer 60. As in the first embodiment, the mask may be formed by using positive photoresist and a reverse mask of the trenches or by negative photoresist and a nonreversed trench mask. In either case, the photolithographic mask will be sized-up so that the mask formed overlying the trenches will be larger than the trenches.

In the preferred embodiment, the mask is formed by using positive photoresist for the masking layer 76. The photolithographic mask is a reversed version of the upper trench mask sized-up between about 0.1 microns and 5.0 microns per side.

The organic BARC layer 72 is etched using the mask formed by the patterned masking layer as an etching mask. The organic BARC layer 72 is etched using a dry etch process such as a combination of one or more of the following gases: $CH_4$, $CHF_3$, $BCl_3$, $Cl_2$, HBr, and oxygen.

Figure 11:
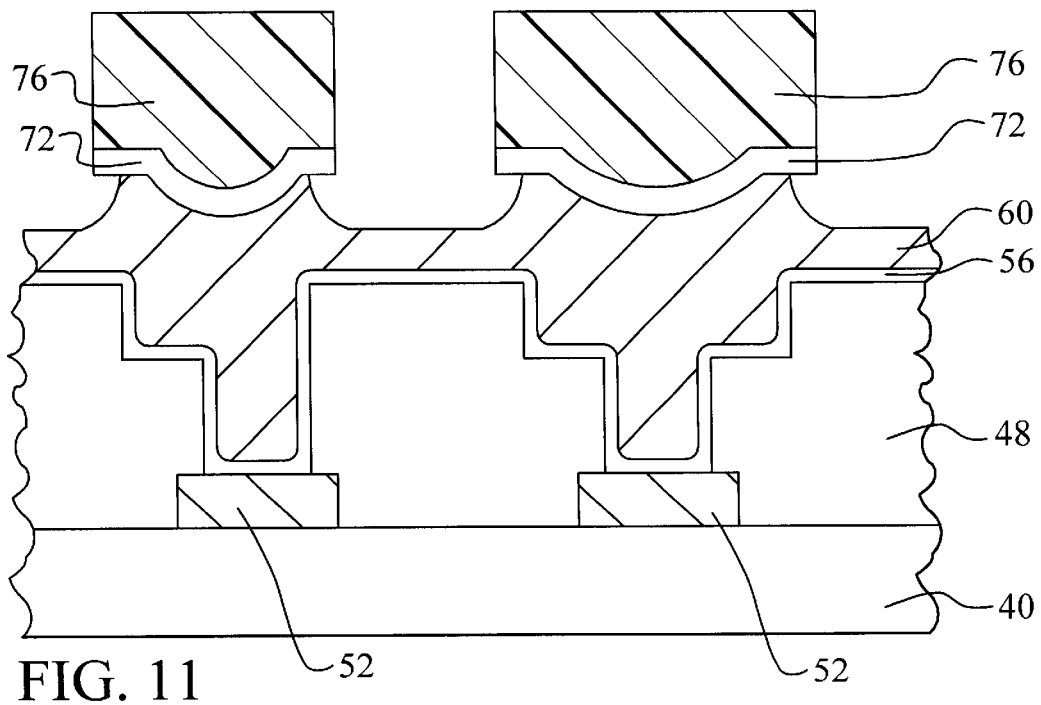

Referring now to FIG. 11, the metal layer 60 is etched down where not covered by the mask composed of the masking layer 76 and the organic BARC layer 72. The etching down is performed using a wet etching or dry etching process. The wet etching process may comprise a buffered oxide etching (BOE) consisting of $NH_4F$, HF, and $H_2O$, with or without a surfactant. A second alternative is dilute HF with or without a surfactant. A third alternative is a developer, such as tetramethylammonium hydroxide (TMAH), tetraethylammonium hydroxide (TEAH), or tetrapropylammonium hydroxide (TPAH), with or without a surfactant. A fourth alternative is $NH_4F$, $CH_3COOH$, and $H_2O$, with or without a surfactant. If an anisotropic wet etch is desired, benzotriazole (BTA) may be added to any of the above wet etch chemistries. Alternatively, a plasma dry etching using, for example, chlorine with or without $BCl_3$ may be used. In this preferred embodiment, a wet etch chemistry of BOE with surfactant is used.

Figure 12:
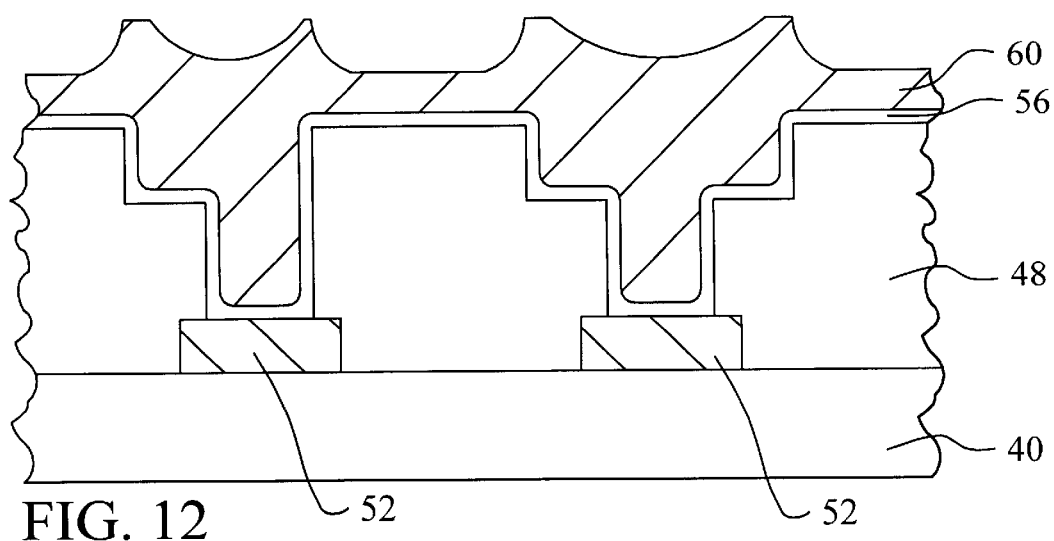

Referring now to FIG. 12, the masking layer 76 and the organic BARC layer 72 are etched away. In the preferred embodiment, the masking layer 76 is photoresist that can be stripped away using a conventional stripping process such as oxygen plasma ashing or a wet chemical strip. The organic BARC layer 72 is stripped away using the same photoresist stripping process.

Figure 13:
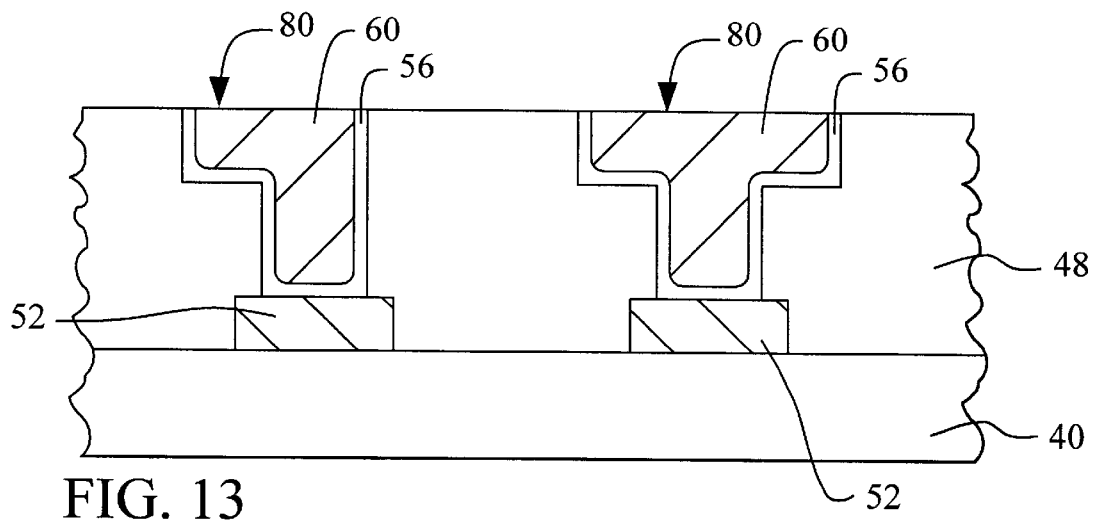

Referring now to FIG. 13, the metal layer 60 and the barrier layer 56 are polished down to the top surface of the dielectric layer 48. The polishing down is performed using a conventional chemical mechanical polish (CMP) operation selective to copper and the barrier material (tantalum nitride and tantalum, for example). The greater thickness of the metal layer 60 overlying the trenches provides additional polishing time for both the metal layer and the barrier layer 56 to be completely removed from the non-trench areas. No dishing is seen over the trenches, rather, a flat surface topology 80 is achieved.

Referring again back to FIG. 3, a third preferred embodiment is now disclosed. The third preferred embodiment begins with the integrated circuit device shown in FIG. 3.

Referring again to FIG. 9, an important feature of the third embodiment of the present invention is disclosed. An inorganic bottom anti-reflective coating layer 72, called an inorganic BARC layer 72, is deposited overlying the metal layer 60. The purpose of the inorganic BARC layer 72 is, first, to improve the photolithographic process used to define the etching mask by reducing the reflectivity of the metal layer 60. Without a BARC layer 72, reflections of incident light off the metal layer 60 during the photolithography process can cause distortion in the exposure of the photoresist. The second purpose of the inorganic BARC layer 72 is to keep the photoresist material out of contact with the metal layer 60 to prevent contamination.

The third purpose of the inorganic BARC layer is to act as a hard mask for the metal etch down process. The inorganic BARC layer 72 is preferably comprised of silicon oxynitride (SiON). The silicon oxynitride is deposited by chemical vapor deposition (CVD) to a thickness of between about 100 Angstroms and 5,000 Angstroms.

A masking layer 76 is deposited overlying the inorganic BARC layer 72. The masking layer 76 is preferably photoresist. This photoresist may be of positive or negative type. The masking layer 76 is deposited by spin coating to a thickness of between about 3,000 Angstroms and 15,000 Angstroms.

Referring again to FIG. 10, the masking layer 76 is patterned to form a mask that only overlies the trenches. The masking layer is patterned to be somewhat larger than the trenches. The inorganic BARC layer 72 is then etched down to the metal layer 60. As in the first embodiment, the mask may be formed by using positive photoresist and a reverse mask of the trenches or by negative photoresist and a non-reversed trench mask. In either case, the photolithographic mask will be sized-up so that the mask formed overlying the trenches will be larger than the trenches.

In the third preferred embodiment, the mask is formed by using positive photoresist for the masking layer 76. The photolithographic mask is a reversed version of the upper trench mask sized-up between about 0.1 microns and 5.0 microns per side.

The inorganic BARC layer 72 is etched using the mask formed by the patterned masking layer as an etching mask. The inorganic BARC layer 72 is etched using a dry etch process such as a combination of one or more of $CF_4$, $CHF_3$, $SF_6$, $BCl_3$, $Cl_2$, HBr, and $C_4F_8$.

Figure 14:
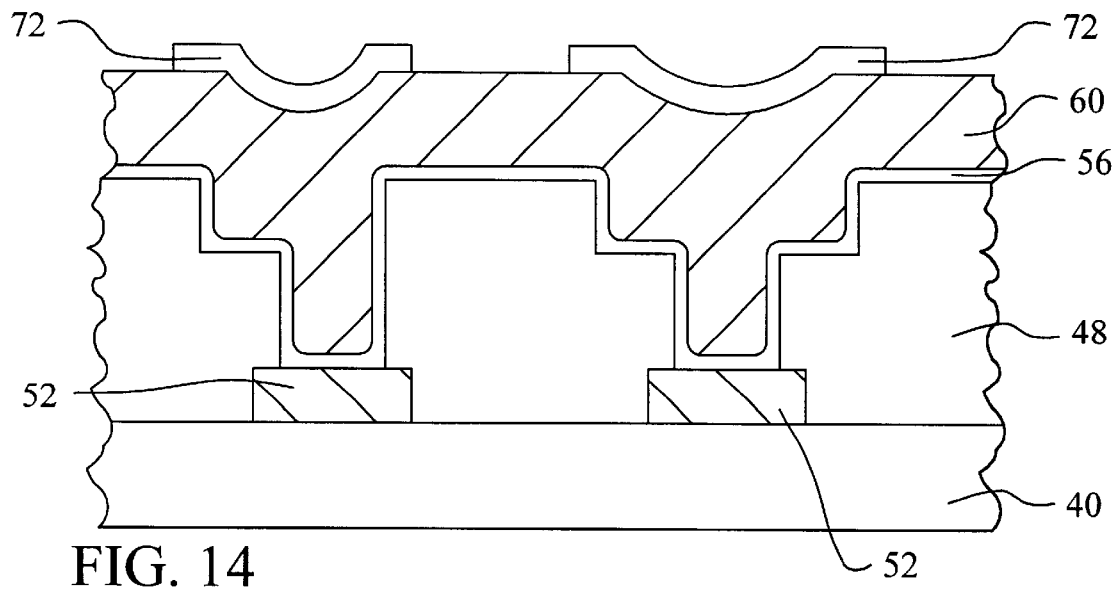

Referring now to FIG. 14, another important feature of the third embodiment of the present invention is disclosed. The masking layer 76 is ashed away leaving the inorganic BARC layer 72 as the mask. The masking layer 76 can be stripped away using a conventional stripping process such as oxygen plasma ashing or a wet chemical strip.

Figure 15:
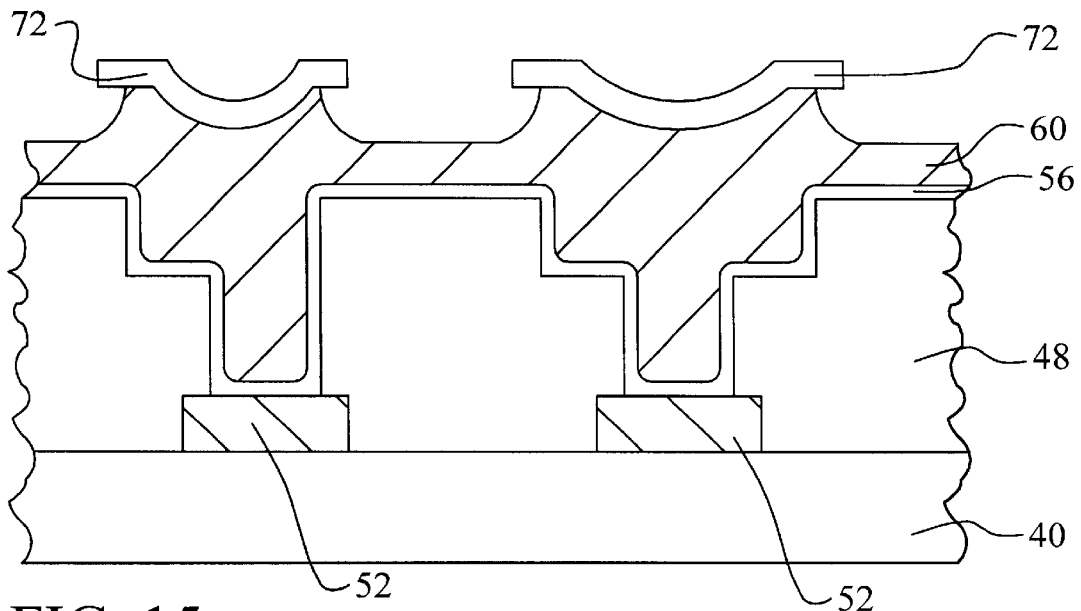

Referring now to FIG. 15, the metal layer 60 is etched down where not covered by the mask composed of the inorganic BARC layer 72. The etching down is performed using a wet etching process. The wet etching process is comprised of an organic solvent stripper, such as the combination of $CCl_4$ and dimethylsulfoxide (DMSO). The use of the inorganic BARC layer 72, comprising silicon oxynitride, enables the use of an organic stripper to perform the etching down step. Alternatively, a plasma dry etching using chlorine with or without $BCl_3$ can be used.

Figure 16:
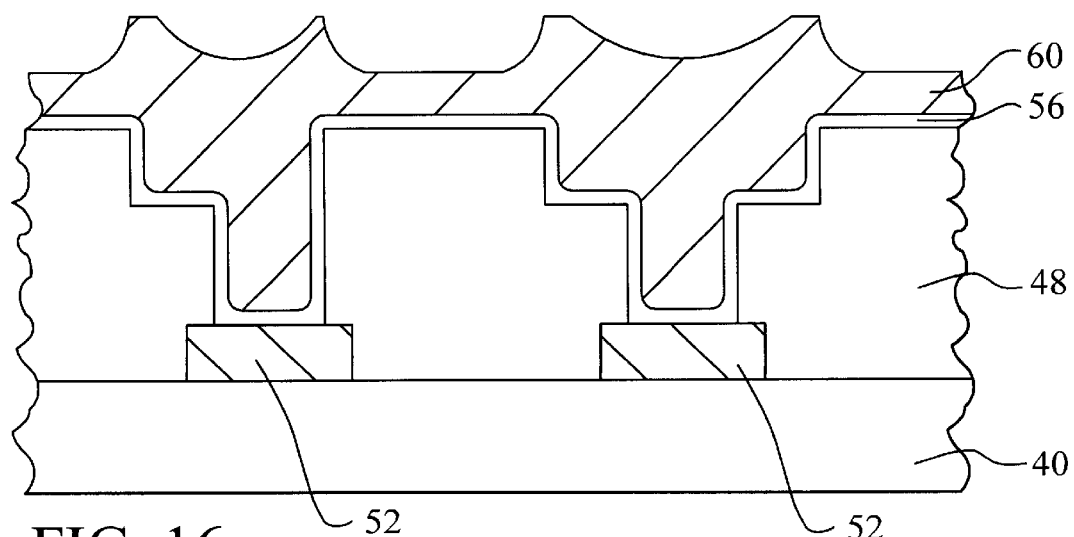
Figure 17:
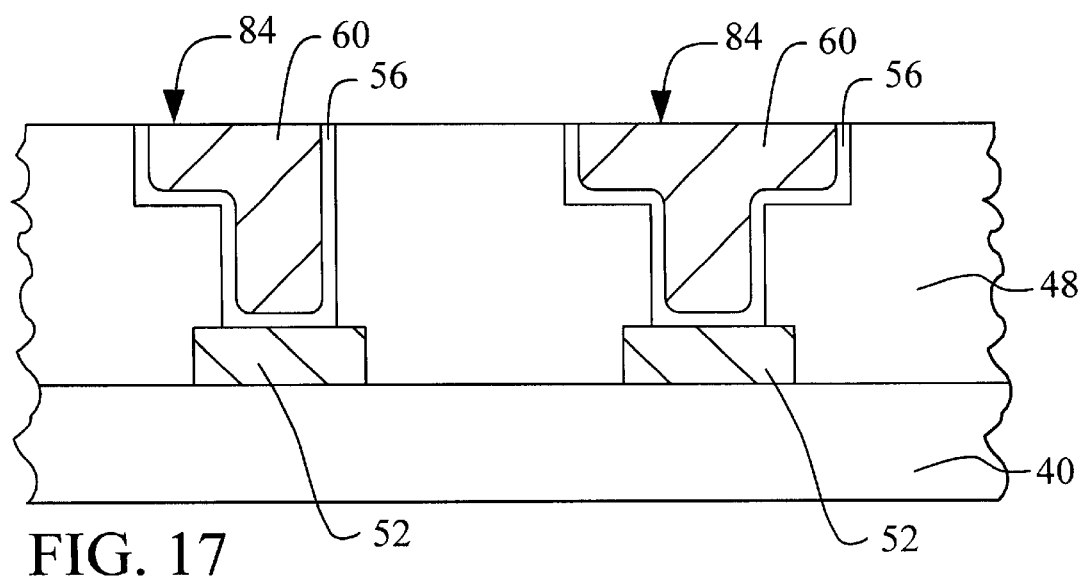

The final step of the third embodiment can be carried out in one of two ways. The first technique requires two steps:

removal of the inorganic BARC layer 72 and polish down of the metal layer 60. Referring now to FIG. 16, the inorganic BARC layer 72 is etched away. The inorganic BARC layer 72 is etched using a conventional hot phosphoric acid ($H_3PO_4$) dip. Alternatively, a dry etching comprising an etching chemistry of one or more of the following: $CF_4$, $CHF_3$, $SF_6$, $BCl_3$, $Cl_2$, HBr, and $C_4F_8$. Referring now to FIG. 17, the metal layer 60 and the barrier layer 56 are polished down to the top surface of the dielectric layer 48.

Referring now to FIG. 17, the preferred technique is to polish down the inorganic BARC layer 72, the metal layer 60 and the barrier layer 56 in one step. The polishing down is performed using a conventional chemical mechanical polish (CMP) operation selective to copper and the barrier material (tantalum nitride and tantalum, for example). This technique has the advantage of not requiring the additional etching step.

As with the first and second embodiments, the greater thickness of the metal layer 60 overlying the trenches provides additional polishing time for both the metal layer and the barrier layer 56 to be completely removed from the non-trench areas. No dishing is seen over the trenches, rather, a flat surface topology 84 is achieved.

As shown in the preferred embodiments, the present invention provides a very manufacturable process for removing excess metal in the fabrication of damascene and dual damascene interconnects in the manufacture of integrated circuit devices.

While the invention has been particularly shown and described with reference to the preferred embodiments thereof, it will be understood by those skilled in the art that various changes in form and details may be made without departing from the spirit and scope of the invention.

What is claimed is:

1. A method to remove excess metal in the formation of interconnects in the manufacture of an integrated circuit device comprising:

providing a semiconductor substrate;

providing a dielectric layer overlying said semiconductor substrate wherein trenches are formed for planned interconnects;

providing a barrier layer overlying said dielectric layer and lining said trenches;

providing a metal layer overlying said barrier layer and completely filling said trenches;

depositing a masking layer overlying said metal layer;

patterning said masking layer to form a mask only overlying said trenches wherein said mask is larger than said trenches;

etching down said metal layer where not covered by said mask wherein said etching down thins said metal layer but does not expose said barrier layer and wherein said metal layer underlying said mask is thicker than said metal layer not underlying said mask;

removing said masking layer; and thereafter polishing down said metal layer and said barrier layer to the top surface of said dielectric layer to form said planned interconnects in the manufacture of said integrated circuit device.

2. The method according to claim 1 further comprising:

depositing an organic BARC layer overlying said metal layer before said step of depositing said masking layer;

patterning said organic BARC layer during said step of patterning said masking layer; and removing said BARC layer during said step of removing said masking layer.

3. The method according to claim 1 further comprising:

depositing an inorganic BARC layer overlying said metal layer before said step of depositing said masking layer;

patterning said inorganic BARC layer during said step of patterning said masking layer to thereby form an inorganic BARC mask with a pattern matching that of said mask;

removing said masking layer prior to said step of etching down said metal layer such that said mask present in said step of etching down said metal layer comprises only said inorganic BARC mask; and polishing down said inorganic BARC layer during polishing down of said metal layer and said barrier layer.

4. The method according to claim 1 wherein said masking layer comprises photoresist.

5. The method according to claim 1 wherein said metal layer comprises copper.

6. The method according to claim 1 wherein said step of etching down said metal layer is by a wet etch comprising one of the group containing: buffered oxide etching (BOE) consisting of $NH_4F$, HF, and $H_2O$ with a surfactant, buffered oxide etching (BOE) consisting of $NH_4F$, HF, and $H_2O$ without a surfactant, dilute HF with a surfactant, dilute HF without a surfactant, tetramethylammonium hydroxide (TMAH) with a surfactant, tetraethylammonium hydroxide (TEAH) with a surfactant, tetrapropylammonium hydroxide (TPAH) with a surfactant, tetramethylammonium hydroxide (TMAH) without a surfactant, tetraethylammonium hydroxide (TEAH) without a surfactant, tetrapropylammonium hydroxide (TPAH) without a surfactant, $NH_4F$, $CH_3COOH$, and $H_2O$ with a surfactant, and $NH_4F$, $CH_3COOH$, and $H_2O$ without a surfactant.

7. The method according to claim 1 wherein said step of etching down said metal layer is by a dry etching chemistry comprising an etching chemistry of one of the group containing: chlorine with $BCl_3$ and chlorine without $BCl_3$.

8. The method according to claim 1 wherein said interconnects are one of the group of: damascene structures and dual damascene structures.

9. A method to remove excess metal in the formation of interconnects in the manufacture of an integrated circuit device comprising:

providing a semiconductor substrate;

providing a dielectric layer overlying said semiconductor substrate wherein trenches are formed for planned interconnects and wherein said planned interconnects are one of the group of: damascene structures and dual damascene structures;

providing a barrier layer overlying said dielectric layer and lining said trenches;

providing a metal layer overlying said barrier layer and completely filling said trenches;

depositing an organic BARC layer overlying said metal layer;

depositing a masking layer overlying said metal layer;

patterning said masking layer to form a mask only overlying said trenches wherein said mask is larger than said trenches;

etching down said organic BARC layer to said metal layer;

etching down said metal layer where not covered by said mask wherein said etching down thins said metal layer but does not expose said barrier layer and wherein said metal layer underlying said mask is thicker than said metal layer not underlying said mask;

etching away said organic BARC layer;

etching away said masking layer; and thereafter polishing down said metal layer and said barrier layer to the top surface of said dielectric layer to form said planned interconnects in manufacture of said integrated circuit device.

10. The method according to claim 9 wherein said masking layer comprises photoresist.

11. The method according to claim 9 wherein said metal layer comprises copper.

12. The method according to claim 9 wherein said step of etching down said metal layer comprises a wet etch chemistry comprising one of the group containing: buffered oxide etching (BOE) consisting of $NH_4F$, HF, and $H_2O$ with a surfactant, buffered oxide etching (BOE) consisting of $NH_4F$, HF, and $H_2O$ without a surfactant, dilute HF with a surfactant, dilute HF without a surfactant, tetramethylammonium hydroxide (TMAH) with a surfactant, tetraethylammonium hydroxide (TEAH) with a surfactant, tetrapropylammonium hydroxide (TPAH) with a surfactant, tetramethylammonium hydroxide (TMAH) without a surfactant, tetraethylammonium hydroxide (TEAH) without a surfactant, tetrapropylammonium hydroxide (TPAH) without a surfactant, $NH_4F$, $CH_3COOH$, and $H_2O$ with a surfactant, and $NH_4F$, $CH_3COOH$, and $H_2O$ without a surfactant.

13. The method according to claim 12 further comprising adding benzotriazole (BTA) to the wet etch chemistry to cause anisotropic etching.

14. The method according to claim 12 further comprising adding benzotriazole (BTA) to the wet etch chemistry to cause anisotropic etching.

15. The method according to claim 9 wherein said organic BARC layer comprises one of the group of: polyacrylate-based material, poly(arylsulfonate)-based material.

16. A method to remove excess metal in the formation of interconnects in the manufacture of an integrated circuit device comprising:

providing a semiconductor substrate;

providing a dielectric layer overlying said semiconductor substrate wherein trenches are formed for planned interconnects and wherein said planned interconnects are one of the group of: damascene structures and dual damascene structures;

providing a barrier layer overlying said dielectric layer and lining said trenches;

providing a metal layer overlying said barrier layer and completely filling said trenches;

depositing an inorganic BARC layer overlying said metal layer;

depositing a masking layer overlying said metal layer;

patterning said masking layer to form a first mask only overlying said trenches wherein said mask is larger than said trenches;

patterning said inorganic BARC layer to form an inorganic BARC mask having a pattern the same as said first mask;

etching away said masking layer;

etching down said metal layer where not covered by said inorganic BARC mask wherein said etching down thins said metal layer but does not expose said barrier layer and wherein said metal layer underlying said inorganic BARC mask is thicker than said metal layer not underlying said inorganic BARC mask; and thereafter polishing down said inorganic BARC layer, said metal layer and said barrier layer to the top surface of said dielectric layer to form said planned interconnects in the manufacture of said integrated circuit device.

17. The method according to claim 16 wherein said masking layer comprises photoresist.

18. The method according to claim 16 wherein said metal layer comprises copper.

19. The method according to claim 16 wherein said inorganic BARC layer comprises silicon oxynitride.

20. The method according to claim 16 wherein said etching down of said metal layer is by an organic solvent stripper comprising the combination of $CCl_4$ and DMSO.

21. The method according to claim 16 wherein said etching down of said metal layer is by a dry etching process comprising an etching chemistry of one of the group containing: chlorine with $BCl_3$ and chlorine without $BCl_3$.

* * * * *

UNITED STATES PATENT AND TRADEMARK OFFICE
CERTIFICATE OF CORRECTION

PATENT NO. : 6,376,361 B1 Page 1 of 1
DATED : April 23, 2002
INVENTOR(S) : Simon Chooi, Mei Sheng Zhou and Tak Yan Tse It is certified that error appears in the above-identified patent and that said Letters Patent is hereby corrected as shown below:

<u>Title page, Item [54] and Column 1, lines 1-3,</u>
Delete "METHOD TO REMOVE EXCESS METAL IN THE FORMATION OF DAMASCENE AND DUAL INTERCONNECTS" and replace it with -- METHOD TO REMOVE EXCESS METAL IN THE FORMATION OF DAMASCENE AND DUAL DAMASCENE INTERCONNECTS --.

Signed and Sealed this

First Day of October, 2002

Attest:

Attesting Officer

JAMES E. ROGAN
*Director of the United States Patent and Trademark Office*